(12) United States Patent
Umeda et al.

(10) Patent No.: US 10,896,868 B2
(45) Date of Patent: Jan. 19, 2021

(54) ELECTRONIC DEVICE AND CONNECTOR

(71) Applicant: SHINDENGEN ELECTRIC MANUFACTURING CO., LTD., Tokyo (JP)

(72) Inventors: Soichiro Umeda, Hanno (JP); Yuji Morinaga, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/466,619

(22) PCT Filed: Feb. 20, 2017

(86) PCT No.: PCT/JP2017/006026
§ 371 (c)(1),
(2) Date: Jun. 4, 2019

(87) PCT Pub. No.: WO2018/150556
PCT Pub. Date: Aug. 23, 2018

(65) Prior Publication Data
US 2019/0318982 A1   Oct. 17, 2019

(51) Int. Cl.
*H01L 21/00* (2006.01)
*H01L 23/00* (2006.01)
(Continued)

(52) U.S. Cl.
CPC .... *H01L 23/49551* (2013.01); *H01L 21/4842* (2013.01); *H01L 23/49562* (2013.01);
(Continued)

(58) Field of Classification Search
CPC ............. H01L 21/4842; H01L 21/6836; H01L 21/822; H01L 21/565; H01L 21/56;
(Continued)

(56) References Cited

U.S. PATENT DOCUMENTS

| 5,001,545 A | 3/1991 | Kalfus et al. |
| 2013/0241047 A1 | 9/2013 | Omae et al. |
| 2017/0025331 A1 | 1/2017 | Kamiyama et al. |

FOREIGN PATENT DOCUMENTS

| JP | S60129136 U | 8/1985 |
| JP | S63170961 U | 11/1988 |

(Continued)

OTHER PUBLICATIONS

International Search Report for PCT/JP2017/006026, dated Apr. 25, 2017, and its English translation provided by WIPO.
(Continued)

*Primary Examiner* — Nikolay K Yushin
(74) *Attorney, Agent, or Firm* — Ladas & Parry, LLP

(57) ABSTRACT

An electronic device has a sealing part 90, an electronic element 95 provided in the sealing part 90, a first terminal that projects outward from the sealing part 90 and a connector 51 that has a head part 40 connected to a front surface of the electronic element 95 via a conductive adhesive 75, and a proximal end part 45 connected to the first terminal via a conductor layer 75. The head part 40 has a single first projection part 41 that projects toward the electronic element 95. The first projection part 41 sinks into the conductive adhesive 75 and comes into point contact with the front surface of the electronic element 95. The proximal end part 45 has a plurality of protrusion parts 49 or a support surface 46, contacting the conductor layer 70.

7 Claims, 13 Drawing Sheets

(51) Int. Cl.
*H01L 23/495* (2006.01)
*H01L 21/48* (2006.01)

(52) U.S. Cl.
CPC ........ *H01L 23/49575* (2013.01); *H01L 24/06* (2013.01); *H01L 24/48* (2013.01); *H01L 2224/0603* (2013.01); *H01L 2224/48091* (2013.01); *H01L 2224/48247* (2013.01)

(58) Field of Classification Search
CPC ............. H01L 21/566; H01L 23/49562; H01L 23/49524; H01L 23/36; H01L 23/48; H01L 23/49575; H01L 23/49531; H01L 23/49551; H01L 23/49513; H01L 24/06; H01L 24/48; H01L 24/27; H01L 24/32; H01L 24/49; H01L 2224/40245; H01L 2224/0603; H01L 2224/48247; H01L 2224/48091; H01L 2924/00014; H01L 2924/00; H01L 2924/181; H01L 2924/14; H01L 2924/014
See application file for complete search history.

(56) References Cited

FOREIGN PATENT DOCUMENTS

| JP | H02126659 A | 5/1990 | |
|----|----|----|----|
| JP | 10-294473 | * 10/1998 | ........... H01L 29/861 |
| JP | 2003078093 A | 3/2003 | |
| JP | 2008108886 A | 5/2008 | |
| JP | 2011249395 A | 12/2011 | |
| JP | 2012104708 A | 5/2012 | |
| JP | 2015012065 A | 1/2015 | |
| WO | 2012127696 A1 | 9/2012 | |
| WO | 2016084483 A1 | 6/2016 | |

OTHER PUBLICATIONS

Written Opinion for PCT/JP2017/006026, dated Apr. 25, 2017, and its English translation provided by Google Translate.
Extended European Search Report from EP app. No. 17896779.0, dated Jul. 20, 2020.

* cited by examiner

ELECTRONIC DEVICE AND CONNECTOR

CROSS-REFERENCE TO RELATED APPLICATION

The present application is the U.S. national phase of PCT Application PCT/JP2017/006026 filed on Feb. 20, 2017, the disclosure of which is incorporated herein by reference in its entirety.

TECHNICAL FIELD

The present invention relates to an electronic device and a connector.

BACKGROUND ART

It has been known to mount a semiconductor element on a conductor layer of a substrate, and connect, via a connector, a front surface of the semiconductor element and a terminal by using a conductive adhesive such as solder (JP 2015-12065 A). The size of the connector increases as larger current flows in a semiconductor device. The large-sized connector thus adopted may sink into the conductive adhesive, and come into contact with the semiconductor element on a head part side. However, a sufficient thickness of the conductive adhesive such as solder is necessary for improvement of reliability.

SUMMARY OF INVENTION

Technical Problem

In consideration of the aforementioned circumstances, the present invention provides a highly reliable electronic device capable of preventing loss of balance while securing a sufficient thickness of a conductive adhesive on the side of a head part of a connector even when the head part sinks into the conductive adhesive, and further provides a connector included in this electronic device.

Solution to Problem

An electronic device according to an example of the present invention comprises:
a sealing part;
an electronic element provided in the sealing part;
a first terminal that projects outward from the sealing part; and
a connector that has a head part connected to a front surface of the electronic element via a conductive adhesive, and a proximal end part connected to the first terminal via a conductor layer, wherein
the head part has a single first projection part that projects toward the electronic element,
the first projection part sinks into the conductive adhesive, and comes into point contact with the front surface of the electronic element, and
the proximal end part has a plurality of protrusion parts or a support surface.

In the electronic device according to an example of the present invention,
the proximal end part may be connected to the conductor layer via a conductive adhesive,
the proximal end part may have the support surface and a recess part provided at a circumferential edge of the support surface.

In the electronic device according to an example of the present invention,
the proximal end part may have a bent part which extends while bent toward a front surface side, and
the recess part may extend toward the front surface side at least to the bent part.

In the electronic device according to an example of the present invention,
the head part may have a second projection part which projects toward the electronic element, and
the first projection part may project toward the electronic element from the second projection part.

In the electronic device according to an example of the present invention,
the proximal end part may have the support surface, and assuming that a line connecting a center of the proximal end part in a width direction and a center of the head part in a width direction is a first direction, a length of the support surface in the first direction may be smaller than a length of the second projection in the first direction.

In the electronic device according to an example of the present invention,
the first projection part may be positioned at a center of the head part in a width direction.

In the electronic device according to an example of the present invention,
the first projection part may have a linear part positioned on a base side of the first projection part and having a linear vertical cross-sectional shape, and a hemispherical shape part positioned on a tip end side of the linear part and having a hemispherical or circular-arc vertical cross-sectional shape.

A connector, according to an example of the present invention, is a connector used for an electronic device having a sealing part, an electronic element provided in the sealing part and a first terminal that projects outward from the sealing part, the connector comprises:
a head part connected to a front surface of the electronic element via a conductive adhesive; and
a proximal end part connected to the first terminal via a conductor layer, wherein
the head part has a single first projection part that projects toward the electronic element,
the first projection part sinks into the conductive adhesive, and comes into point contact with the front surface of the electronic element, and
the proximal end part has a plurality of protrusion parts contacting with the conductor layer or a support surface contacting with the conductor layer.

Advantageous Effects of Invention

According to the present invention, there are provided the single first projection part coming into point contact with the front surface of the electronic element and the proximal end part has the plurality of protrusion parts or the support surface, even when the head part sinks into the conductive adhesive by the weight of the connector. Accordingly, an electronic element, in which loss of balance is preventable while securing a sufficient thickness of the conductive adhesive on the head part side, and a connector used for such an electronic element can be provided.

DESCRIPTION OF EMBODIMENTS

First Embodiment

<<Configuration>>

Figure 1:
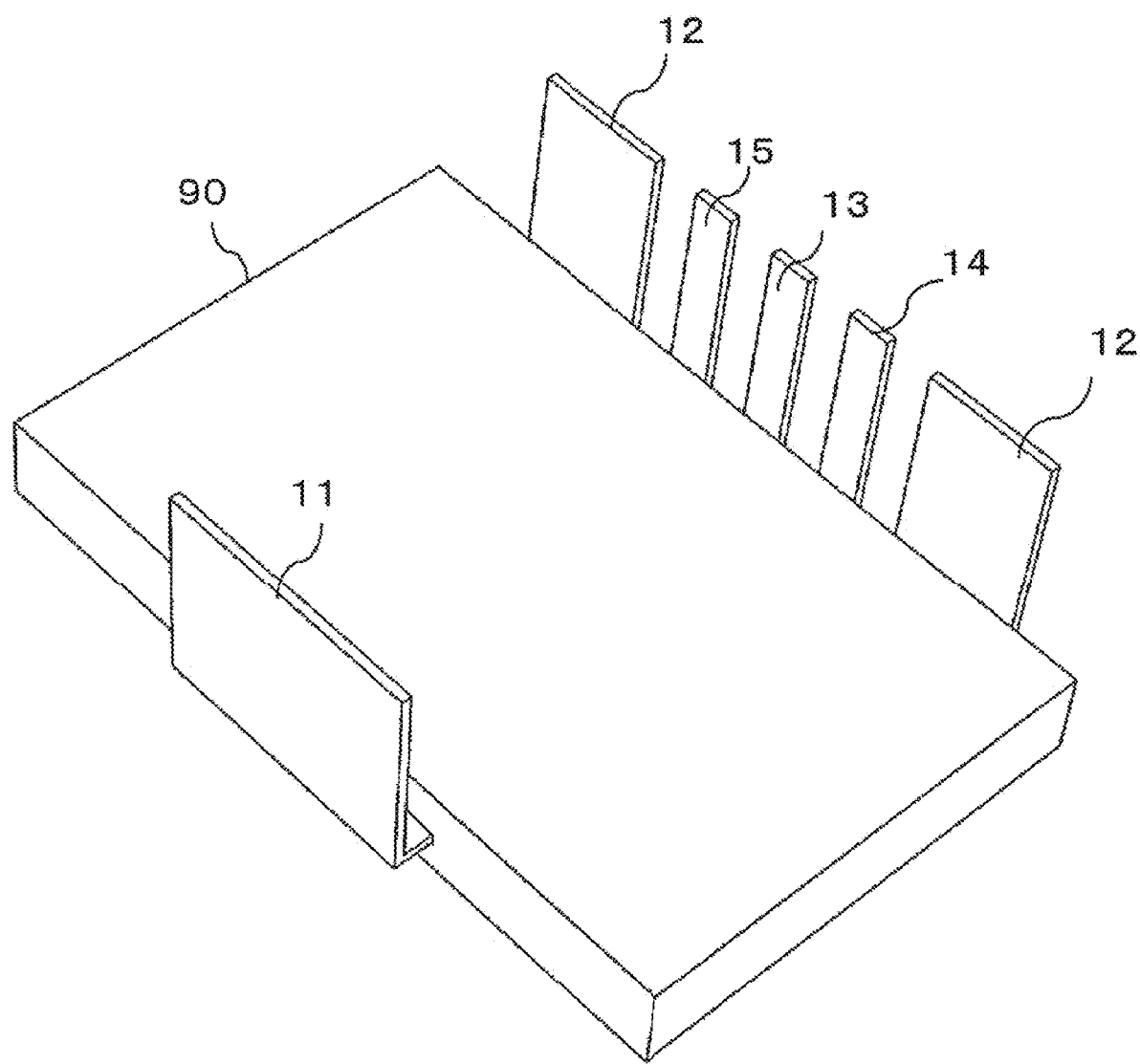
FIG. 1 is a perspective view of a semiconductor device according to a first embodiment of the present invention.
Figure 2:
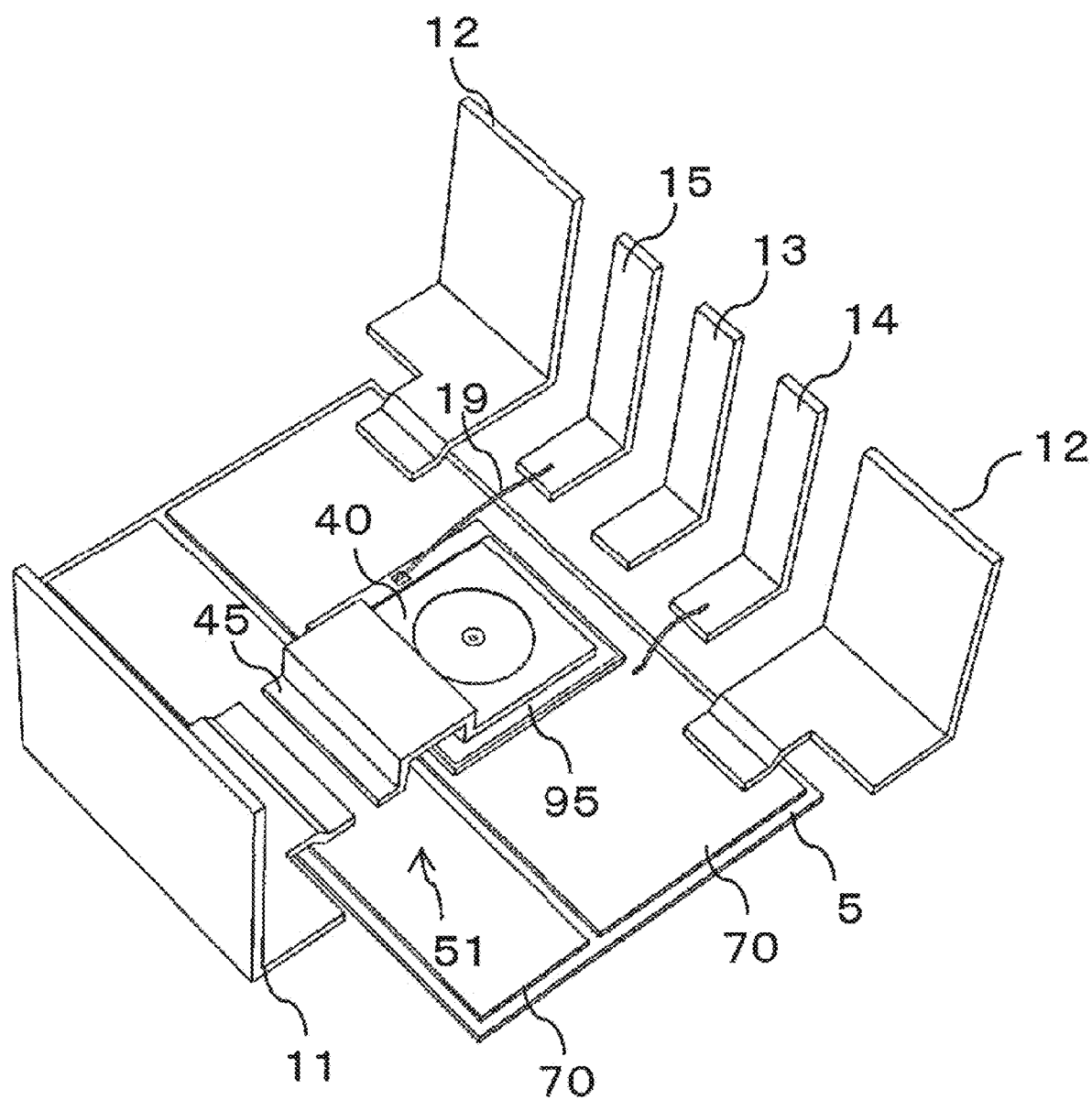
FIG. 2 is a perspective view illustrating an aspect that a sealing part is removed from the semiconductor device according to the first embodiment of the present invention.
Figure 3:
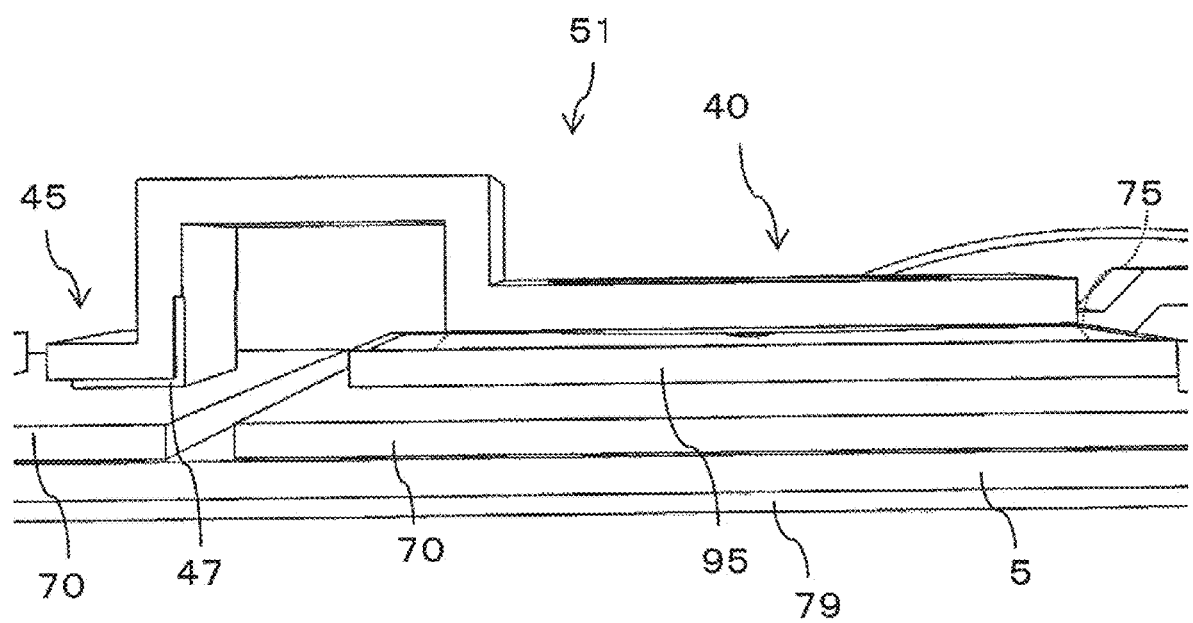
FIG. 3 is a side view illustrating an enlarged region around a connector in FIG. 2.

As illustrated in FIG. 2, a semiconductor device presented by way of example of an electronic device according to the present embodiment may have a substrate 5 made of an insulation material, and a conductor layer 70 provided on the substrate 5 and made of copper or other material, for example. A heat sink 79 (see FIG. 3) made of copper or other material may be provided on a rear surface of the substrate 5. As illustrated in FIG. 2, the semiconductor device may have a sealing part 90 (see FIG. 1) made of sealing resin or other material, a semiconductor element 95 provided in the sealing part 90, a first main terminal 11 projecting outward from the sealing part 90, and second main terminals 12 projecting outward from the sealing part 90. As illustrated in FIG. 3, the semiconductor device may have a connector 51 which has a head part 40 connected to a front surface of the semiconductor element 95 via a conductive adhesive 75 such as solder, and a proximal end part 45 connected to the first main terminal 11 via the conductor layer 70.

According to the present embodiment, an electronic device constituted by the semiconductor device, and an electronic element constituted by the semiconductor element 95 will be described. However, each of the electronic device and the electronic element is not limited to this specific example, and need not be particularly constituted by a "semiconductor".

According to an aspect illustrated in FIG. 2, the second main terminals 12 are connected to the conductor layer 70. The second main terminals 12 are connected to a rear surface of the semiconductor element 95 via the conductor layer 70. A resist (not shown) may be provided at circumferential edges of connection portions between the second main terminals 12 and the conductor layer 70 to prevent outflow of a conductive adhesive such as solder. The rear surface of the semiconductor element 95 and the conductor layer 70 may be connected to each other via a conductive adhesive such as solder.

Figure 5:
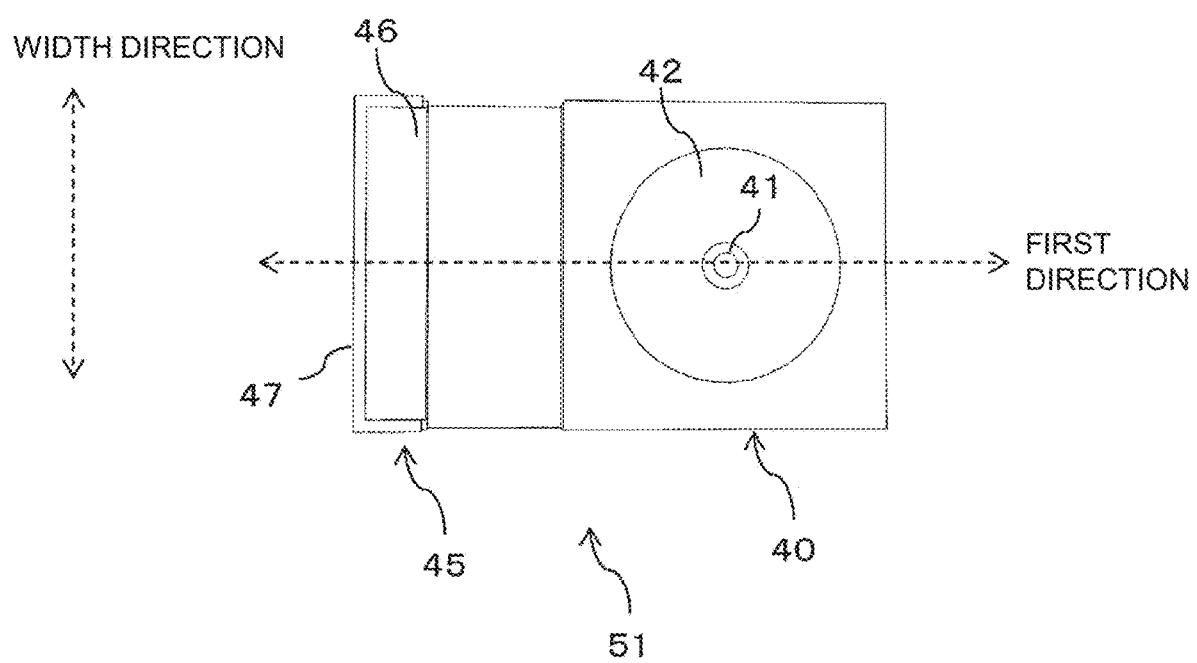
FIG. 5 is a bottom view illustrating the connector adopted in the first embodiment of the present invention.
Figure 11:
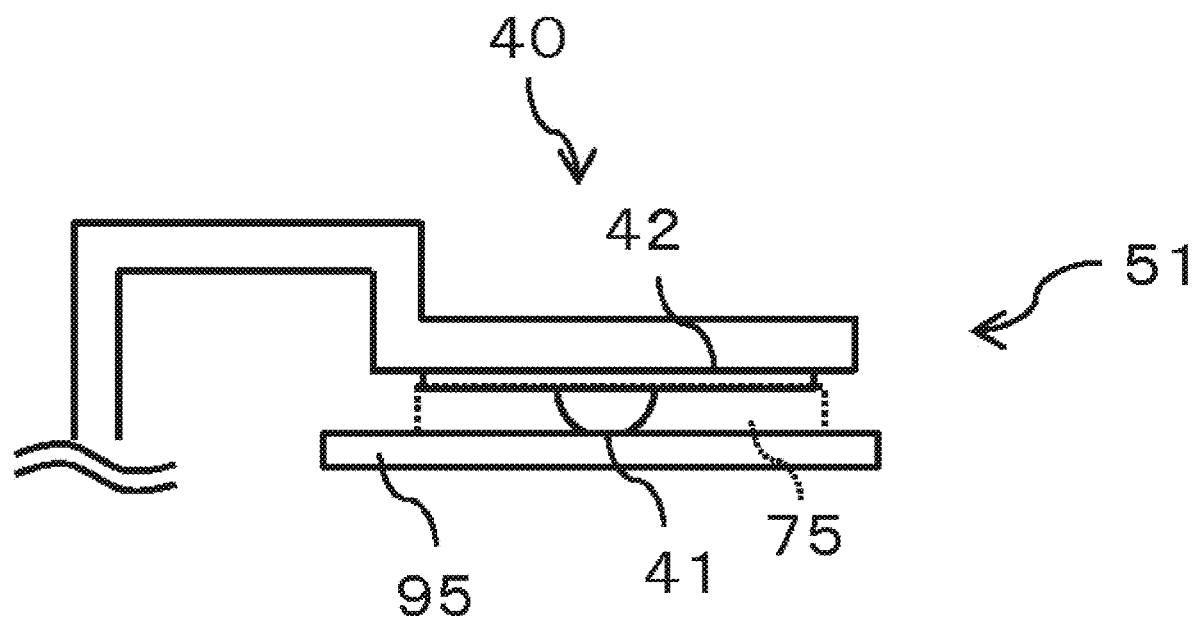
FIG. 11 is a side view illustrating an aspect that the first projection part of the connector adopted in the first embodiment of the present invention sinks into the conductive adhesive and comes into contact with a semiconductor element.
Figure 12:
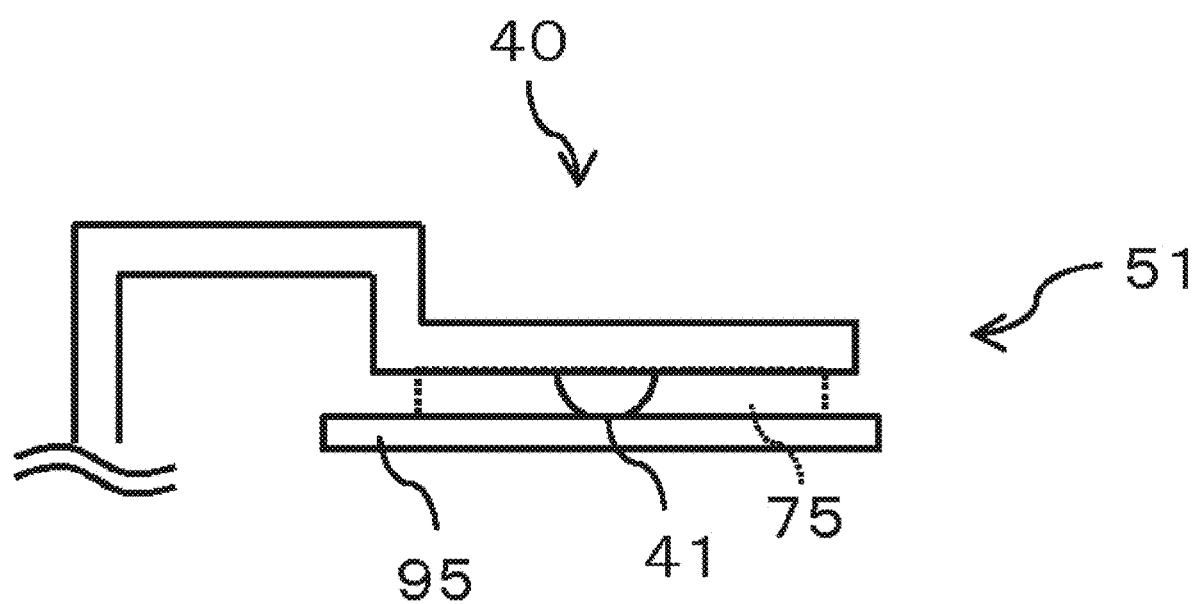
FIG. 12 is a side view illustrating an aspect that a first projection part of a connector adopted in a modified example of the first embodiment of the present invention sinks into the conductive adhesive and comes into contact with the semiconductor element.

As illustrated in FIG. 5, the head part 40 has a single first projection part 41 which projects toward the semiconductor element 95. The first projection part 41 sinks into the conductive adhesive 75 to come into point contact with the front surface of the semiconductor element 95 (see FIGS. 11 and 12). The proximal end part 45 may have a support surface 46 which is brought into contact with the conductor layer 70, or formed on the conductive adhesive 75 provided on the conductor layer 70. Note that the "point" in the present embodiment may have a certain area. In addition, the point contact between the first projection part 41 and the front surface of the semiconductor element 95 refers to a contact between the front surface of the semiconductor element 95 and a portion of the first projection part 41 closest to the front surface of the semiconductor element 95.

The front surface of the semiconductor element 95 illustrated in FIG. 2 is electrically connected to the first main terminal 11, while the rear surface of the semiconductor element 95 is electrically connected to the second main terminals 12. According to the present embodiment, there is provided a front surface side sensing terminal 13 which projects outward from the sealing part 90 to perform source side sensing (hereinafter referred to as "front surface side sensing terminal 13"). According to the present embodiment, a first terminal constituted by the first main terminal 11 where main current flows, and a second terminal constituted by the front surface side sensing terminal 13 where main current flows will be described. However, other configurations may be adopted. Such an aspect which includes a first terminal where main current does not flow, or such an aspect which includes a second terminal not used for sensing is adoptable. The front surface side sensing terminal 13 is electrically connected to the proximal end part 45 via a not-shown wire or the like.

Figure 4:
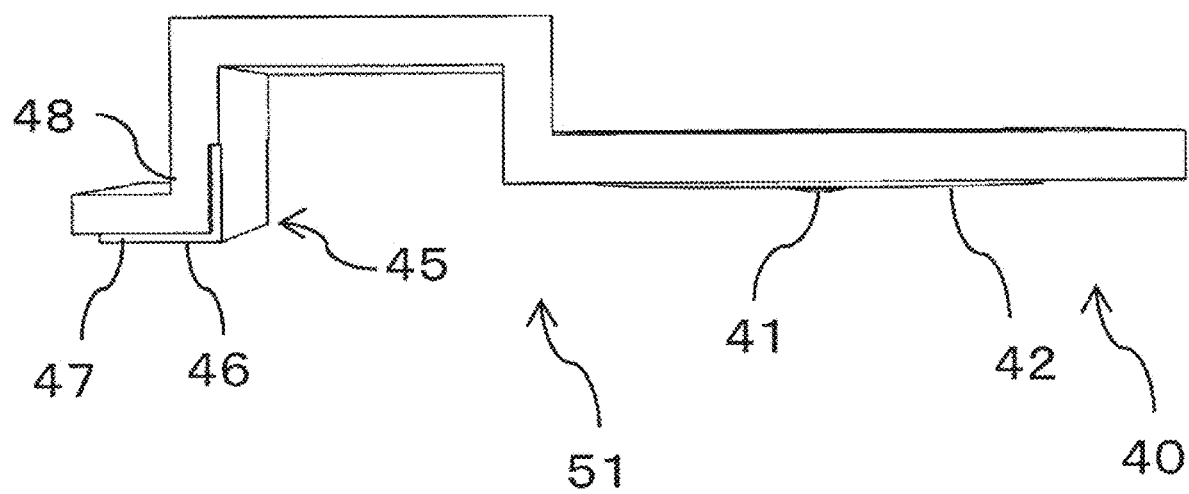
FIG. 4 is a side view illustrating the connector adopted in the first embodiment of the present invention.

As illustrated in FIGS. 4 and 5, the proximal end part 45 may have the support surface 46, and a recess part 47 provided at a circumferential edge of the support surface 46. The recess part 47 may be provided in such a shape as to surround the entire support surface 46, or in such a shape as to continuously surround three sides of the support surface 46 on the proximal end side as illustrated in FIG. 5. Alternatively, the recess part 47 may be formed in such a shape as to surround the support surface 46 not continuously but discontinuously. In addition, the proximal end part 45 may have a bent part 48 which extends while bent toward the front surface side (upper side in FIG. 3). The recess part 47 may extend toward the front surface side along the bent part 48 extending from the support surface 46 toward the front surface side. The aspect which includes the recess part 47 extending toward the front surface side along the bent part 48 is advantageous in that a fillet is easily formed by a conductive adhesive provided along the recess part 47 provided in the bent part 48.

Figure 8:
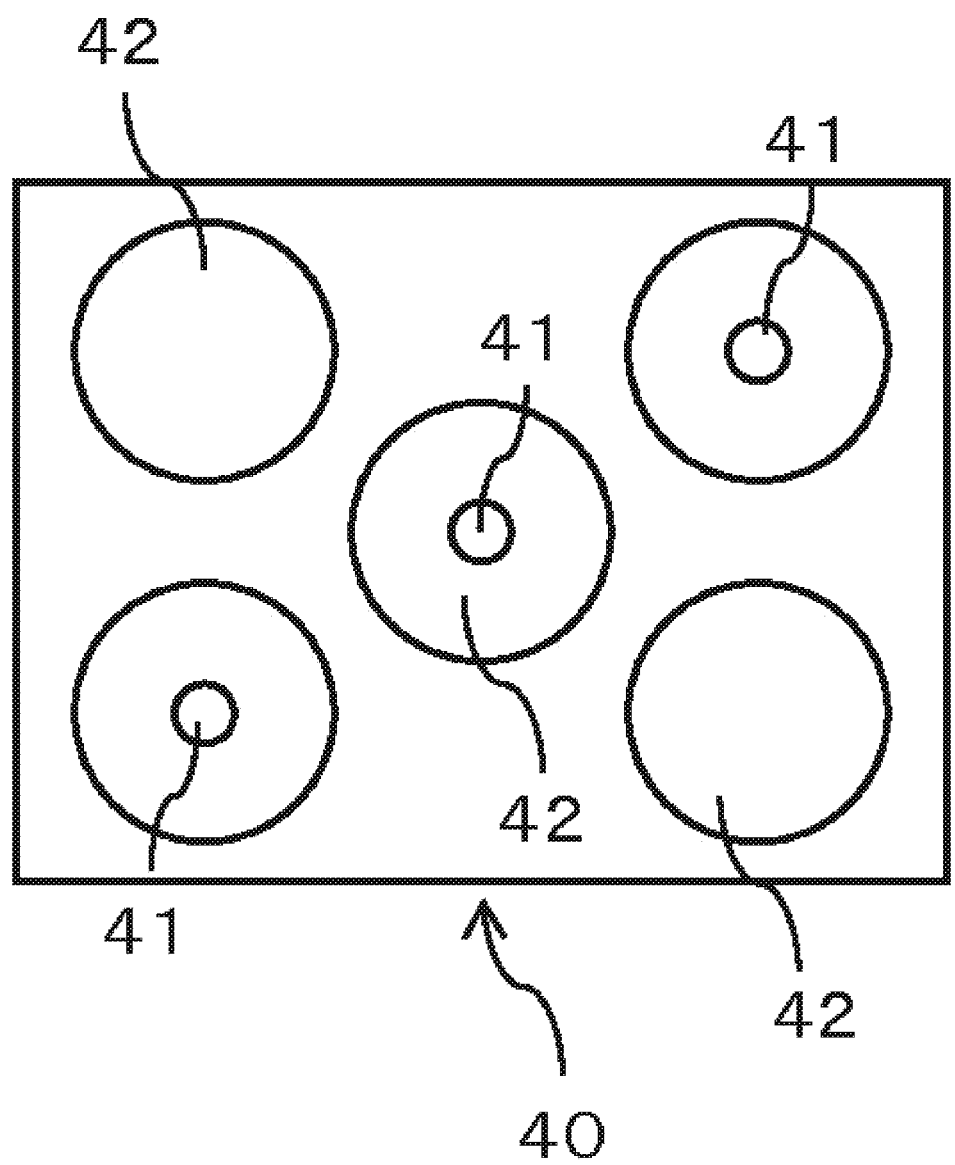
FIG. 8 is a bottom view illustrating a modified example of a head part.
Figure 9:
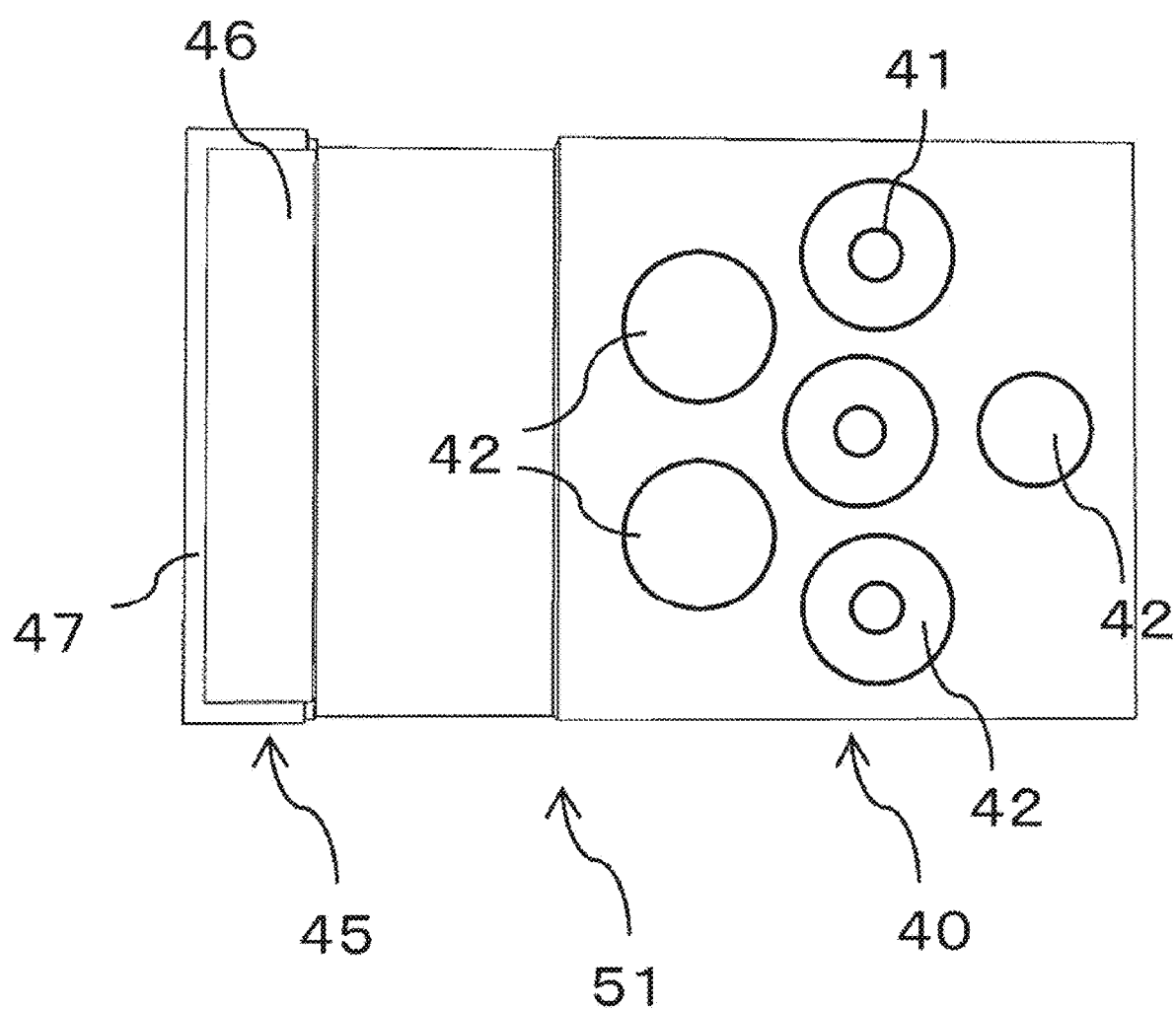
FIG. 9 is a bottom view illustrating another modified example of the head part.
Figure 10:
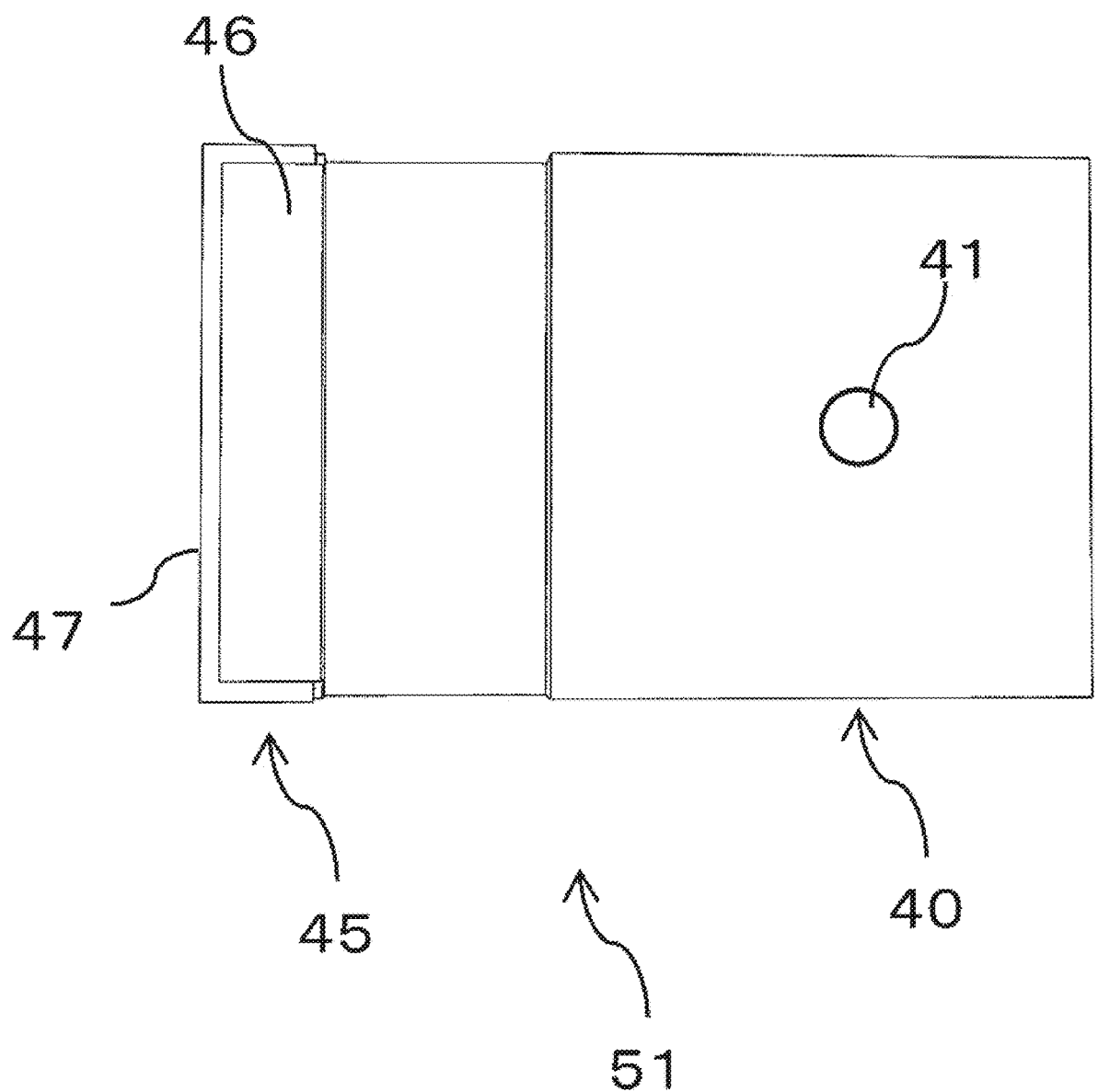
FIG. 10 is a bottom view illustrating a modified example of the connector adopted in the first embodiment of the present invention.

As illustrated in FIGS. 4 and 5, the head part 40 may have a second projection part 42 which projects toward the semiconductor element 95, or may not have the second projection part 42 as illustrated in FIG. 10. An aspect in which the only one first projection part 41 and the only one second projection part 42 are provided may be adopted. However, as illustrated in FIGS. 8 and 9, a plurality of the first projection parts 41 and a plurality of the second projection parts 42 may be provided. Further, an aspect in which the first projection part 41 is not provided in some of a plurality of the second projection parts 42 as illustrated in FIGS. 8 and 9 may be adopted.

Assuming that a line connecting a center of the proximal end part 45 in a width direction (up-down direction in FIG. 5) and a center of the head part 40 in a width direction is a first direction (left-right direction in FIG. 5), the length of the support surface 46 in the first direction may be smaller than the length of the second projection 42 in the first direction (see FIG. 5).

The first projection part 41 may be positioned at the center of the head part 40 in the width direction.

Each of the first main terminal 11 and the second main terminal 12 may be a power terminal where large current (e.g., 200 A to 300 A or larger) flows. Large current flows in the connector 51 when each of the first main terminal 11 and the second main terminal 12 is constituted by this type of power terminal. In this case, the size of the connector 51 increases. Accordingly, the connector 51 may easily sink into the conductive adhesive 75.

According to the aspect illustrated in FIG. 1, the second main terminals 12, the front surface side sensing terminal 13, a rear surface side sensing terminal 14, and a control terminal 15 project outward from one side surface of the sealing part 90, while the first main terminal 11 projects outward from the other side surface of the sealing part 90. Each of the first main terminal 11, the second main terminals 12, the front surface side sensing terminal 13, the rear surface side sensing terminal 14, and the control terminal 15 is bent toward the front surface side to be connected to the control substrate 5 provided on the front surface side. The control substrate 5 is provided to control the semiconductor element 95.

The structure of the semiconductor device inside the sealing part 90 may be linearly symmetrical. For example, each of the first main terminal 11, the second main terminal 12, the front surface side sensing terminal 13, the rear surface side sensing terminal 14, the control terminal 15, and the conductor layer 70 may be disposed linearly symmetrical with respect to any line. Note that a wire 19 is also illustrated in FIG. 2.

<<Operations and Effects>>

Operations and effects produced by the present embodiment having the foregoing configurations are now described.

According to the present embodiment, there are provided the single first projection part 41 coming into point contact with the front surface of the semiconductor element 95, and the proximal end part 45 has the support surface 46, even when the head part 40 sinks into the conductive adhesive 75 by the weight of the connector 51. Accordingly, loss of balance is preventable while securing a sufficient thickness of the conductive adhesive 75 on the head part 40 side.

According to the aspect adopted in FIGS. 5 and 10, the only one first projection part 41 is provided. In this case, the conductive adhesive 75 can be positioned throughout a region not provided with the first projection part 41. This aspect is advantageous in that the conductive adhesive 75 can achieve securer fixation between the head part 40 and the semiconductor element 95.

The support surface 46 of the proximal end part 45 can contact the conductor layer 70, or float in the conductive adhesive 75 (before hardening) in a balanced manner. Loss of balance of the connector 51 is more securely preventable in case of the support surface 46 contacting the conductor layer 70. On the other hand, in case of the support surface 46 floating in the conductive adhesive 75, bonding between the proximal end part 45 and the conductor layer 70 is more securely achievable after the conductive adhesive 75 is hardened.

According to the aspect adopted in FIG. 5, the proximal end part 45 connected to the conductor layer 70 via the conductive adhesive 75 such as solder has the support surface 46, and the recess part 47 provided at the circumferential edge of the support surface 46. In this case, the conductive adhesive 75 can reach and enter the recess part 47, and therefore can easily form a fillet (e.g., solder fillet). Accordingly, generation of cracks or the like after hardening of the conductive adhesive 75 due to an insufficient quantity of the conductive adhesive 75 is preventable. Particularly when the connector 51 is heavy enough to make a contact between the support surface 46 and the conductor layer 70, the recess part 47 thus provided is advantageous in that bonding between the proximal end part 45 and the conductor layer 70 is achievable by the conductive adhesive 75 having entered the recess part 47. In this case, also advantageous is the aspect which includes the recess part 47 extending toward the front surface side along the bent part 48 as adopted in FIG. 4.

According to the aspect adopted in FIG. 5, the head part 40 has the second projection part 42 projecting toward the semiconductor element 95, and the first projection part 41 projecting toward the semiconductor element 95 from the second projection part 42. In this case, the thickness of the conductive adhesive 75 such as solder can be increased to a certain thickness in a region not provided with the first projection part 41. Moreover, the thickness of the conductive adhesive 75 can be further increased in a region provided with neither the first projection part 41 nor the second projection part 42. Particularly in such an aspect that the first projection part 41 and the front surface of the semiconductor element 95 contact each other when the head part 40 sinks into the conductive adhesive 75 by the weight of the connector 51, the conductive adhesive 75 having an appropriate thickness can be provided between the head part 40 and the front surface of the semiconductor element 95 by adjustment of the thicknesses (heights) of the first projection part 41 and the second projection part 42 to appropriate values. Moreover, a current path having a sufficient width can be produced by adjustment of the width of the second projection part 42 to an appropriate value.

Furthermore, there are limitations to the quantity of the conductive adhesive 75 applicable to the front surface of the semiconductor element 95, and the size of the head part 40 allowed to be mounted on the front surface of the semiconductor element 95. Concerning this point, the second projection part 42 in a size sufficient for a necessary area of contact with the conductive adhesive 75 (in-plane direction) is provided to secure an appropriate contact area with the conductive adhesive 75. Accordingly, an appropriate quantity of the conductive adhesive 75 can be secured.

According to the aspect adopted herein (see FIG. 5), the length of the support surface 46 in the first direction is smaller than the length of the second projection part 42 in the first direction. In this case, size reduction of the proximal end part 45 is achievable. Moreover, the length of the support surface 46 in the first direction is smaller than the length of the second projection part 42 in the first direction, but larger than the length of the first projection part 41 in the first direction. Accordingly, loss of balance caused by the support surface 46 is preventable.

According to the aspect adopted herein, the first projection part 41 is positioned at the center of the head part 40 in the width direction. In this case, inclination of the head part 40 in the width direction is preventable. Particularly in the aspect that the first projection part 41 and the front surface of the semiconductor element 95 contact each other when the head part 40 sinks into the conductive adhesive 75 by the weight of the connector 51, the head part 40 may be inclined in the width direction with respect to a center located at the first projection part 41. Concerning this point, the aspect adopted herein can reduce the possibility of inclination of the head part 40 in the width direction.

Figure 6:
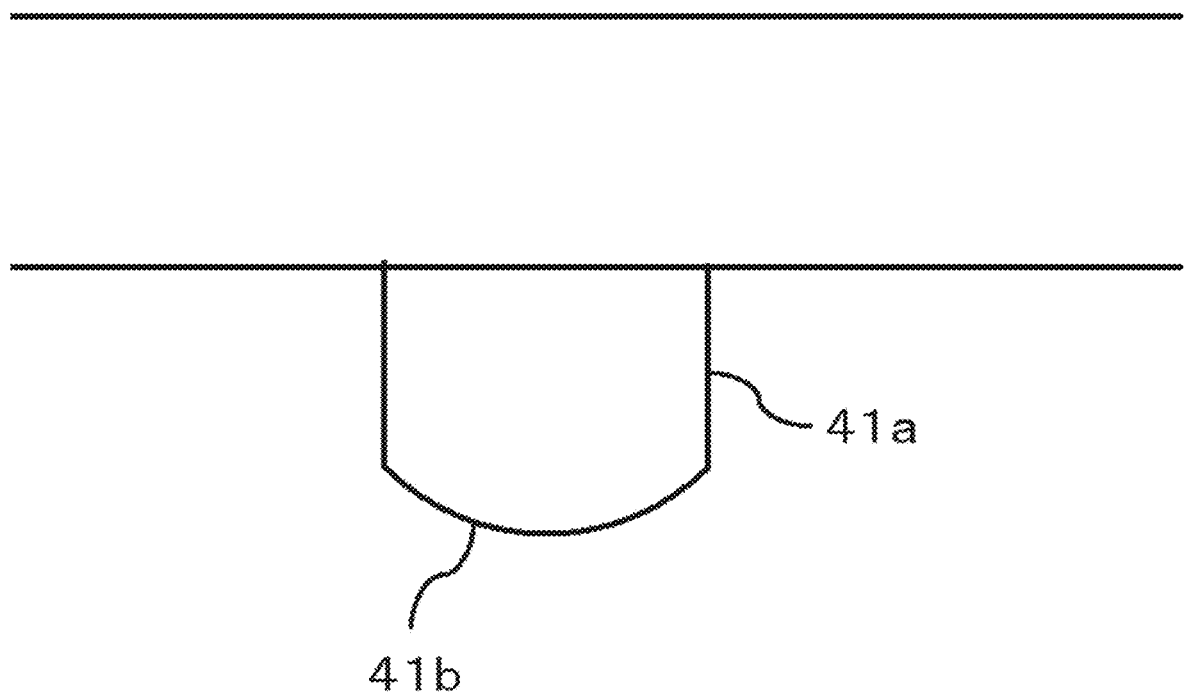
FIG. 6 is a side view illustrating an aspect of a first projection part adopted in the first embodiment of the present invention.
Figure 7:
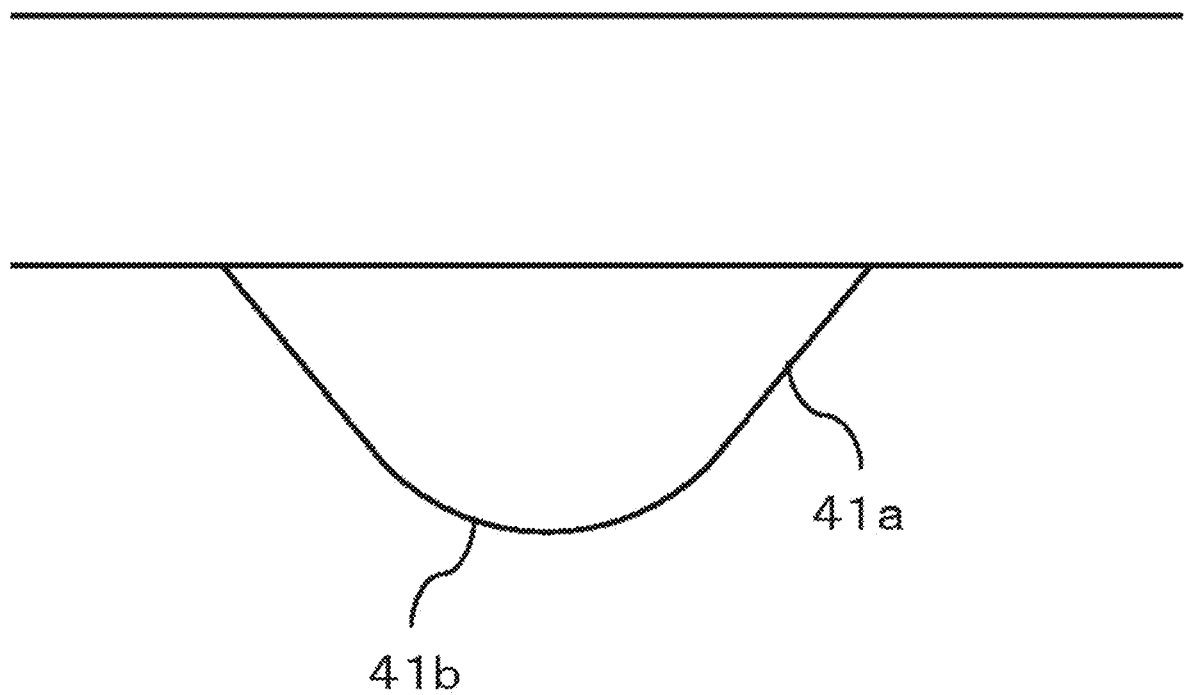
FIG. 7 is a side view illustrating another aspect of the first projection part adopted in the first embodiment of the present invention.

According to an aspect adopted in FIGS. 6 and 7, the first projection part 41 has a linear part 41*a* positioned on a base side of the first projection part 41 and having a linear vertical cross-sectional shape, and a hemispherical shape part 41*b* positioned on a tip end side of the linear part 41*a* and having a hemispherical or circular-arc vertical cross-sectional shape. In this case, reduction of the diameter of the hemispherical shape part 41*b* is achievable. Accordingly, even when the head part 40 sinks into the conductive adhesive 75 and brings the first projection part 41 into contact with the front surface of the semiconductor element 95, the contact area between the first projection part 41 and the front surface of the semiconductor element 95 can be reduced to a smaller area (point contact). As a result, the quantity of the conductive adhesive 75 positioned between the head part 40 and the front surface of the semiconductor element 95 can be raised, wherefore problems such as cracks generated in the conductive adhesive 75 at the time of hardening can be prevented in advance.

According to an aspect adopted in FIG. 7, the linear part 41*a* has a tapered shape narrowed in the direction toward the tip end. In this case, the quantity of the conductive adhesive 75 can be raised on the tip end side. In this case, problems such as cracks generated in the conductive adhesive 75 at the time of hardening can be prevented in advance on the tip end side near the semiconductor element 95. Moreover, the quantity of the conductive adhesive 75 can be gradually raised in the direction toward the tip end side. In this case, the conductive adhesive 75 can be positioned uniformly and securely around the first projection part 41. Accordingly, even in such an aspect that the first projection part 41 and the front surface of the semiconductor element 95 contact each other when the head part 40 sinks into the conductive adhesive 75 by the weight of the connector 51, the possibility of inclination of the head part 40 can decrease. Note that the linear part 41*a* may have a cylindrical shape as illustrated in FIG. 6.

Second Embodiment

A second embodiment according to the present invention is now described.

Figure 13:
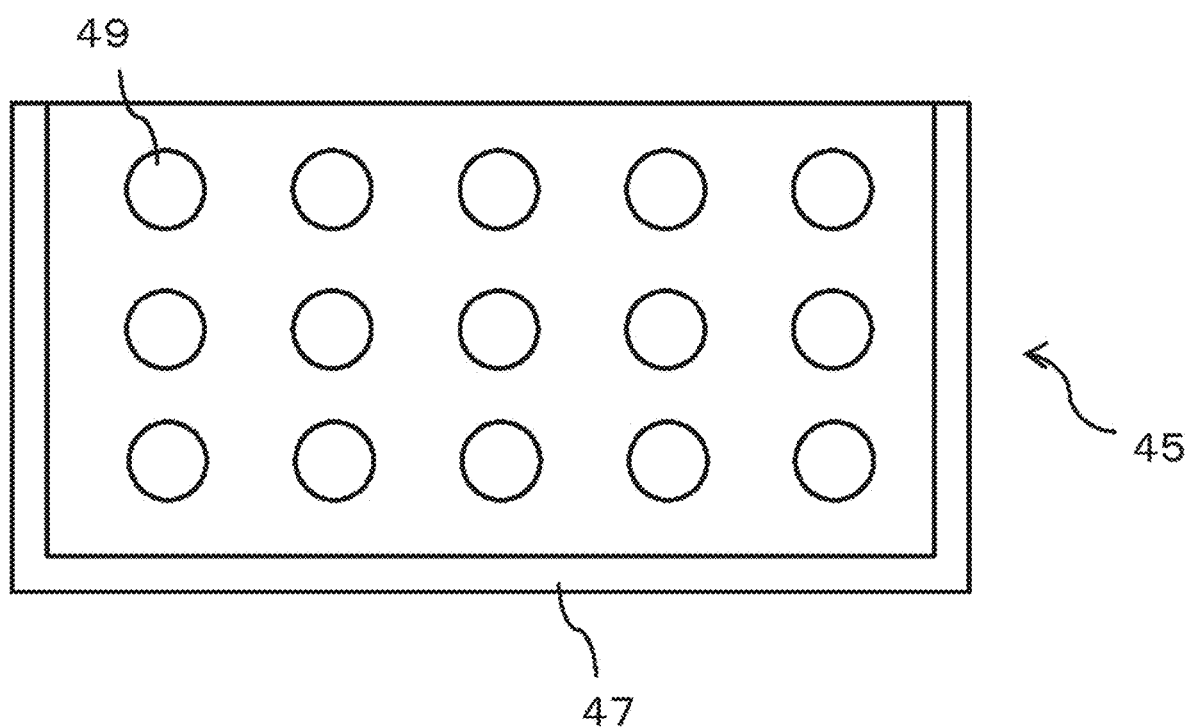
FIG. 13 is a bottom view illustrating a proximal end part of a connector adopted in a second embodiment of the present invention.

According to the aspect described in the first embodiment, the proximal end part 45 of the connector 51 has the support surface 46 in contact with the conductor layer 70. In an aspect described in the second embodiment, however, the proximal end part 45 of the connector 51 has a plurality of protrusion parts 49 in contact with the conductor layer 70 as illustrated in FIG. 13.

Other configurations are similar to the corresponding configurations of the first embodiment. In the second embodiment, components and others identical or similar to the corresponding components and others in the first embodiment are given identical reference numbers, and associated explanation is not repeated. The present embodiment can offer effects similar to the effects produced by the first embodiment.

More specifically, the present embodiment has the single first projection part 41 in point contact with the front surface of the semiconductor element 95, and also the plurality of protrusion parts 49 provided on the proximal end part 45 and coming into contact with the conductor layer 70, even when the head part 40 sinks into the conductive adhesive 75 by the weight of the connector 51. Accordingly, loss of balance is preventable while securing a sufficient thickness of the conductive adhesive 75 on the head part 40 side.

Note that the number of the protrusion parts 49 may be any number not smaller than 2. When only the two protrusion parts 49 are provided, the protrusion parts 49 may be disposed linearly symmetrical or point symmetrical with respect to a line passing through the center of the proximal end part 45 in the width direction (line extending in first direction). In addition, even when the number of the provided protrusion parts 49 is large, the protrusion parts 49 may be provided linearly symmetrical or point symmetrical with respect to the line passing through the center of the proximal end part 45 in the width direction (line extending in first direction) in a similar manner.

Finally, the foregoing description of the respective embodiments, description of the modified examples, and disclosure of the drawings are presented only by way of example to specifically describe the invention claimed in the appended claims. Accordingly, the invention claimed in the appended claims is not limited to the foregoing description of the embodiments or disclosure of the drawings. In addition, the appended claims initially claimed in the present application are presented only by way of example, and the description of the claims can be appropriately modified based on the specification, drawings and the like.

REFERENCE SIGNS LIST

11 First terminal (First main terminal)
13 Second terminal (Front surface side sensing terminal)
40 Head part
41 First projection part
42 Second projection part
45 Proximal end part
46 Support surface
47 Recess part
49 Protrusion part
70 Conductor layer
75 Conductive adhesive
90 Sealing part
95 Semiconductor element (Electronic element)

The invention claimed is:

1. An electronic device comprising:
a substrate;
a first conductor layer and a second conductor layer provided on the substrate;
an electronic element provided on the second conductor layer;
a first terminal connected to the first conductor layer;
a connector that electrically connects a front surface of the electronic element and the first conductor layer;
a sealing part that seals the first conductor layer, the second conductor layer, the electronic element and the connector inside, wherein
the connector has a head part connected to the front surface of the electronic element via a conductive adhesive and a proximal end part connected to the first conductor layer via a conductive adhesive, the head part has a protrusion part protruding toward a side of an electronic element from a facing surface facing the front surface of the electronic element, and a first projection part protruding from the protrusion part toward the side of the electronic element, in a state where the first projection part comes into point contact with the front surface of the electronic element, and the conductive adhesive is bonded to the protrusion part and is bonded to the facing surface of the head part around the protrusion part, the head part is connected to the front surface of the electronic element, the proximal end part has a plurality of second projection parts protruding from a facing surface facing the first conductor layer to a side of the first conductor layer, and the proximal end part is connected to the first conductor layer in a state where the plurality of the second projection parts are in contact with the first conductor layer and the conductive adhesive is bonded to the facing surface of the proximal end part.

2. The electronic device according to claim 1, wherein assuming that a line connecting a center of the proximal end part in a width direction and a center of the head part in a width direction is a first direction, a length of the proximal end part in the first direction is smaller than a length of the protrusion part in the first direction.

3. The electronic device according to claim 1, wherein the first projection part is positioned at a center of the head part in a width direction.

4. The electronic device according to claim 1, wherein the first projection part has a columnar part protruding from the protrusion part toward the side of the electronic element and a hemispherical part provided at a tip of the columnar part.

5. The electronic device according to claim 1, wherein the proximal end part has a recess part provided at a circumferential edge of the facing surface.

6. The electronic device according to claim 5, wherein the connector has an intermediate part that extends in a direction away from the first conductor layer from the proximal end part and further bends and extends toward a side of the head part, and the recess part is provided at a portion of the intermediate part that extends in a direction away from the first conductor layer and the recess part is connected to the proximal end part.

7. A connector in an electronic device having a substrate, a first conductor layer and a second conductor layer provided on the substrate, an electronic element provided on the second conductor layer, a first terminal connected to the first conductor layer, and a sealing part that seals the first conductor layer, the second conductor layer and the electronic element inside, the connector, provided in the sealing part and electrically connecting a front surface of the electronic element and the first conductor layer, comprising:

a head part connected to the front surface of the electronic element via a conductive adhesive and a proximal end part connected to the first conductor layer via a conductive adhesive;

the head part has a protrusion part protruding toward a side of an electronic element from a facing surface facing the front surface of the electronic element, and a first projection part protruding from the protrusion part toward the side of the electronic element;

in a state where the first projection part comes into point contact with the front surface of the electronic element, and the conductive adhesive is bonded to the protrusion part and is bonded to the facing surface of the head part around the protrusion part, the head part is connected to the front surface of the electronic element;

the proximal end part has a plurality of second projection parts protruding from a facing surface facing the first conductor layer to a side of the first conductor layer; and the proximal end part is connected to the first conductor layer in a state where the plurality of the second projection parts are in contact with the first conductor layer and the conductive adhesive is bonded to the facing surface of the proximal end part.

\* \* \* \* \*